United States Patent
Kayama

(10) Patent No.: US 9,537,484 B2
(45) Date of Patent: Jan. 3, 2017

(54) SEMICONDUCTOR DEVICE AND METHOD OF CONTROLLING THE SAME

(71) Applicant: CANON KABUSHIKI KAISHA, Tokyo (JP)

(72) Inventor: Kazuya Kayama, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 140 days.

(21) Appl. No.: 14/523,079

(22) Filed: Oct. 24, 2014

(65) Prior Publication Data

US 2015/0123719 A1 May 7, 2015

(30) Foreign Application Priority Data

Nov. 1, 2013 (JP) ................................ 2013-228754

(51) Int. Cl.
G06F 1/32 (2006.01)
G06F 1/26 (2006.01)
H03K 19/00 (2006.01)

(52) U.S. Cl.
CPC ............ *H03K 19/0008* (2013.01); *G06F 1/26* (2013.01); *G06F 1/32* (2013.01)

(58) Field of Classification Search
CPC ..................................... G06F 1/32; G06F 1/26
See application file for complete search history.

(56) References Cited

U.S. PATENT DOCUMENTS

| 4,414,979 | A | * | 11/1983 | Hirshorn | A61N 1/205 607/51 |
|---|---|---|---|---|---|
| 5,323,067 | A | * | 6/1994 | Shay | H03K 17/223 327/142 |
| 5,805,434 | A | * | 9/1998 | Vinciarelli | H02M 1/34 363/16 |
| 6,473,852 | B1 | * | 10/2002 | Hanjani | G06F 1/24 327/143 |
| 2002/0003442 | A1 | * | 1/2002 | Kuboshima | H03K 17/18 327/198 |
| 2002/0043994 | A1 | * | 4/2002 | Bando | H03K 17/145 327/143 |
| 2002/0149353 | A1 | | 10/2002 | Inaba | 323/283 |
| 2008/0238499 | A1 | * | 10/2008 | Mawet | G06F 1/24 327/143 |
| 2011/0074470 | A1 | * | 3/2011 | Sanborn | H03K 17/223 327/143 |

(Continued)

FOREIGN PATENT DOCUMENTS

JP A 2002-312073 10/2002
JP A 2011-065529 3/2011

*Primary Examiner* — Phil Nguyen
(74) *Attorney, Agent, or Firm* — Fitzpatrick, Cella, Harper & Scinto

(57) ABSTRACT

A semiconductor device comprises a plurality of circuit blocks, each of which performs an assigned operation, and performs a reset operation when recovering from a shutdown state of power supply, and a power control unit configured to control power supply to a power domain comprising at least one circuit block. The reset operation parameters of the plurality of circuit blocks as reset operation targets, for which power supply is resumed by the power control unit, are controlled so as to meet a power condition that makes the power dissipation of the semiconductor device by the reset operation not more than a predetermined power.

16 Claims, 17 Drawing Sheets

(56) References Cited

U.S. PATENT DOCUMENTS

| | | | |
|---|---|---|---|
| 2011/0102027 A1 | 5/2011 | Takahashi et al. | 327/142 |
| 2011/0235393 A1* | 9/2011 | Yoshihara | G11C 11/16 |
| | | | 365/148 |
| 2014/0036573 A1* | 2/2014 | Ishihara | G11C 13/0021 |
| | | | 365/148 |
| 2014/0266335 A1* | 9/2014 | Aoki | H03K 19/0016 |
| | | | 327/142 |

* cited by examiner

| | CIRCUIT BLOCK A | CIRCUIT BLOCK B | CIRCUIT BLOCK C | CIRCUIT BLOCK D |
|---|---|---|---|---|
| REQUIRED NUMBER OF CYCLES | 45 | 90 | 20 | 18 |

FIG. 5

| | CIRCUIT BLOCK A | | | CIRCUIT BLOCK B | | | CIRCUIT BLOCK C | | | CIRCUIT BLOCK D | | |
|---|---|---|---|---|---|---|---|---|---|---|---|---|
| RESET OPERATION MODE | HIGH SPEED | MEDIUM SPEED | LOW SPEED | HIGH SPEED | MEDIUM SPEED | LOW SPEED | HIGH SPEED | MEDIUM SPEED | LOW SPEED | HIGH SPEED | MEDIUM SPEED | LOW SPEED |
| RESET OPERATION PARAMETER (FREQUENCY MHz) | 200 | 100 | 50 | 200 | 100 | 50 | 200 | 100 | 50 | 200 | 100 | 50 |
| ESTIMATED DYNAMIC POWER DISSIPATION (mW) | 80 | 40 | 20 | 150 | 75 | 38 | 60 | 30 | 15 | 50 | 25 | 13 |

FIG. 6A

INITIAL OPERATION PARAMETERS (Ts)

| | CIRCUIT BLOCK A | CIRCUIT BLOCK B | CIRCUIT BLOCK C | CIRCUIT BLOCK D | TOTAL |
|---|---|---|---|---|---|
| RESET OPERATION MODE | MEDIUM SPEED | HIGH SPEED | MEDIUM SPEED | PROHIBIT RESET OPERATION | ✕ |
| RESET OPERATION PARAMETER (FREQUENCY MHz) | 100 | 200 | 100 | 0 | ✕ |
| ESTIMATED DYNAMIC POWER DISSIPATION (mW) | 40 | 150 | 30 | 0 | 220 |

UPDATE OPERATION PARAMETERS (Tce)

| | CIRCUIT BLOCK A | CIRCUIT BLOCK B | CIRCUIT BLOCK C | CIRCUIT BLOCK D | TOTAL |
|---|---|---|---|---|---|
| RESET OPERATION MODE | MEDIUM SPEED | HIGH SPEED | RESET OPERATION COMPLETION | MEDIUM SPEED | ✕ |
| RESET OPERATION PARAMETER (FREQUENCY MHz) | 100 | 200 | 0 | 100 | ✕ |
| ESTIMATED DYNAMIC POWER DISSIPATION (mW) | 40 | 150 | 0 | 25 | 215 |

UPDATE OPERATION PARAMETERS (Tde)

| | CIRCUIT BLOCK A | CIRCUIT BLOCK B | CIRCUIT BLOCK C | CIRCUIT BLOCK D | TOTAL |
|---|---|---|---|---|---|
| RESET OPERATION MODE | MEDIUM SPEED | HIGH SPEED | RESET OPERATION COMPLETION | RESET OPERATION COMPLETION | ✕ |
| RESET OPERATION PARAMETER (FREQUENCY MHz) | 100 | 200 | 0 | 0 | ✕ |
| ESTIMATED DYNAMIC POWER DISSIPATION (mW) | 40 | 150 | 0 | 0 | 190 |

COMPLETION OF RESET OPERATIONS (Tae, Tbe, Te)

| | CIRCUIT BLOCK A | CIRCUIT BLOCK B | CIRCUIT BLOCK C | CIRCUIT BLOCK D | TOTAL |
|---|---|---|---|---|---|
| RESET OPERATION MODE | RESET OPERATION COMPLETION | RESET OPERATION COMPLETION | RESET OPERATION COMPLETION | RESET OPERATION COMPLETION | ✕ |
| RESET OPERATION PARAMETER (FREQUENCY MHz) | 0 | 0 | 0 | 0 | ✕ |
| ESTIMATED DYNAMIC POWER DISSIPATION (mW) | 0 | 0 | 0 | 0 | 0 |

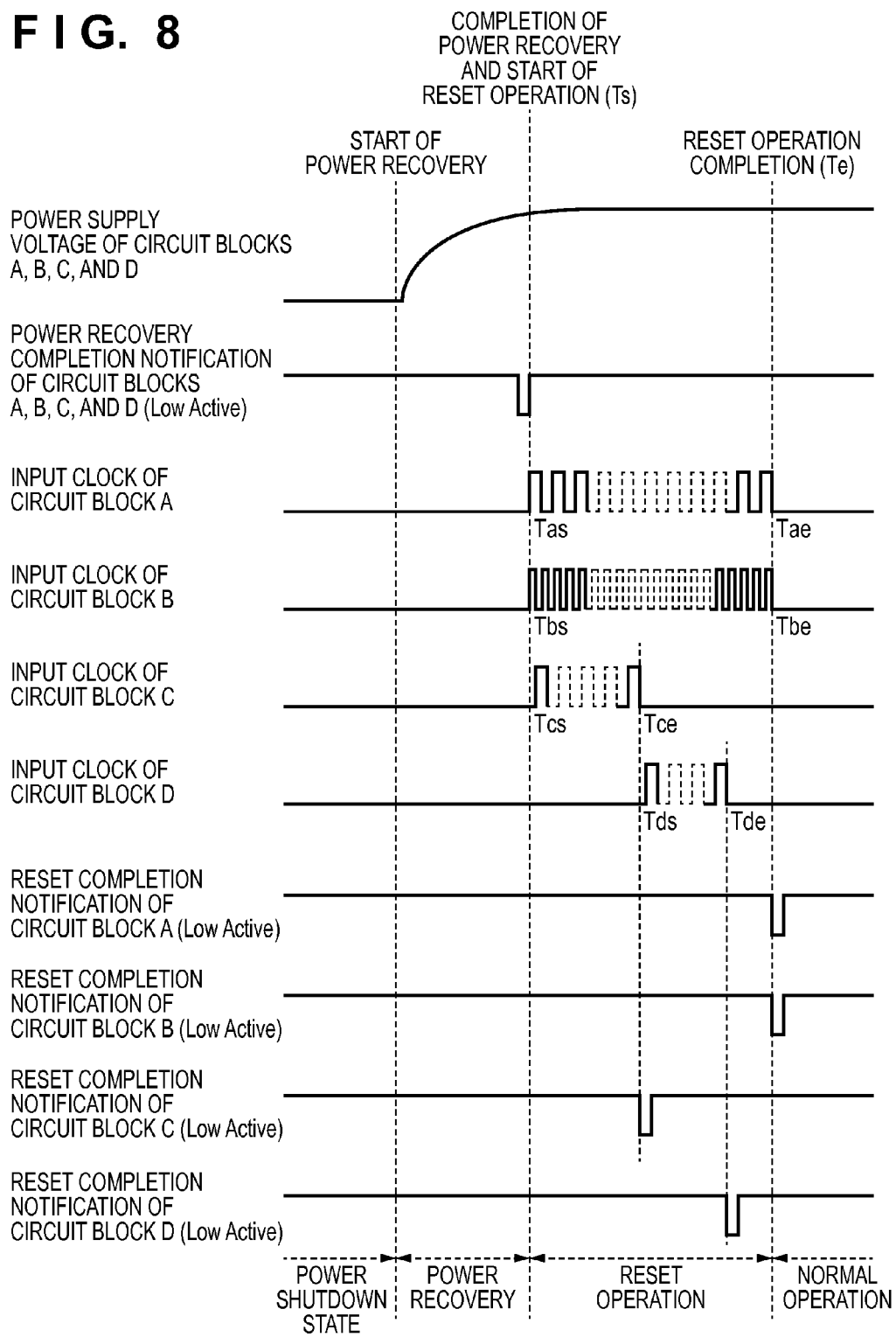

F I G. 10

| RESET OPERATION MODE | CIRCUIT BLOCK A | | | | | CIRCUIT BLOCK B | | | | |
|---|---|---|---|---|---|---|---|---|---|---|
| | ULTRA-HIGH SPEED | HIGH SPEED | MEDIUM SPEED | LOW SPEED | ULTRA-LOW SPEED | ULTRA-HIGH SPEED | HIGH SPEED | MEDIUM SPEED | LOW SPEED | ULTRA-LOW SPEED |
| OPERATION PARAMETER 1 (FREQUENCY MHz) | 400 | 200 | 100 | 50 | 25 | 400 | 200 | 100 | 50 | 25 |
| OPERATION PARAMETER 2 (VOLTAGE V) | 1.3 | 1.1 | 1.1 | 1.1 | 0.9 | 1.3 | 1.1 | 1.1 | 1.1 | 0.9 |
| ESTIMATED DYNAMIC POWER DISSIPATION (mW) | 223 | 80 | 40 | 20 | 6.7 | 419 | 150 | 75 | 38 | 12.7 |

| RESET OPERATION MODE | CIRCUIT BLOCK C | | | | | CIRCUIT BLOCK D | | | | |
|---|---|---|---|---|---|---|---|---|---|---|
| | ULTRA-HIGH SPEED | HIGH SPEED | MEDIUM SPEED | LOW SPEED | ULTRA-LOW SPEED | ULTRA-HIGH SPEED | HIGH SPEED | MEDIUM SPEED | LOW SPEED | ULTRA-LOW SPEED |
| OPERATION PARAMETER 1 (FREQUENCY MHz) | 400 | 200 | 100 | 50 | 25 | 400 | 200 | 100 | 50 | 25 |
| OPERATION PARAMETER 2 (VOLTAGE V) | 1.3 | 1.1 | 1.1 | 1.1 | 0.9 | 1.3 | 1.1 | 1.1 | 1.1 | 0.9 |
| ESTIMATED DYNAMIC POWER DISSIPATION (mW) | 167.6 | 60 | 30 | 15 | 5 | 140 | 50 | 25 | 13 | 4.4 |

INITIAL OPERATION PARAMETERS (Ts)  F I G. 11A

|  | CIRCUIT BLOCK A | CIRCUIT BLOCK B | CIRCUIT BLOCK C | CIRCUIT BLOCK D | TOTAL |
|---|---|---|---|---|---|
| RESET OPERATION MODE | LOW SPEED | ULTRAHIGH SPEED | ULTRALOW SPEED | ULTRALOW SPEED | ✕ |
| RESET OPERATION PARAMETER (FREQUENCY MHz) | 50 | 400 | 25 | 25 | ✕ |
| RESET OPERATION PARAMETER (VOLTAGE V) | 1.1 | 1.3 | 0.9 | 0.9 | ✕ |
| ESTIMATED DYNAMIC POWER DISSIPATION (mW) | 20 | 419 | 5 | 4.4 | 448.4 |

⇩

UPDATE OPERATION PARAMETERS (Tbe)  F I G. 11B

|  | CIRCUIT BLOCK A | CIRCUIT BLOCK B | CIRCUIT BLOCK C | CIRCUIT BLOCK D | TOTAL |
|---|---|---|---|---|---|
| RESET OPERATION MODE | ULTRAHIGH SPEED | RESET OPERATION COMPLETION | ULTRAHIGH SPEED | HIGH SPEED | ✕ |
| RESET OPERATION PARAMETER (FREQUENCY MHz) | 400 | 0 | 400 | 200 | ✕ |
| RESET OPERATION PARAMETER (VOLTAGE V) | 1.3 | 1.1 | 1.3 | 1.1 | ✕ |
| ESTIMATED DYNAMIC POWER DISSIPATION (mW) | 223 | 0 | 167.6 | 50 | 440.6 |

⇩

UPDATE OPERATION PARAMETERS (Tce)  F I G. 11C

|  | CIRCUIT BLOCK A | CIRCUIT BLOCK B | CIRCUIT BLOCK C | CIRCUIT BLOCK D | TOTAL |
|---|---|---|---|---|---|
| RESET OPERATION MODE | ULTRAHIGH SPEED | RESET OPERATION COMPLETION | RESET OPERATION COMPLETION | ULTRAHIGH SPEED | ✕ |
| RESET OPERATION PARAMETER (FREQUENCY MHz) | 400 | 0 | 0 | 400 | ✕ |
| RESET OPERATION PARAMETER (VOLTAGE V) | 1.3 | 1.1 | 1.1 | 1.3 | ✕ |
| ESTIMATED DYNAMIC POWER DISSIPATION (mW) | 223 | 0 | 0 | 140 | 363 |

⇩

F I G. 11D

UPDATE OPERATION PARAMETERS (Tde)

|  | CIRCUIT BLOCK A | CIRCUIT BLOCK B | CIRCUIT BLOCK C | CIRCUIT BLOCK D | TOTAL |
|---|---|---|---|---|---|
| RESET OPERATION MODE | ULTRAHIGH SPEED | RESET OPERATION COMPLETION | RESET OPERATION COMPLETION | RESET OPERATION COMPLETION | ✕ |
| RESET OPERATION PARAMETER (FREQUENCY MHz) | 400 | 0 | 0 | 0 | ✕ |
| RESET OPERATION PARAMETER (VOLTAGE V) | 1.3 | 1.1 | 1.1 | 1.1 | ✕ |
| ESTIMATED DYNAMIC POWER DISSIPATION (mW) | 223 | 0 | 0 | 0 | 223 |

⇩

F I G. 11E

UPDATE OPERATION PARAMETERS (Tae, Te)

|  | CIRCUIT BLOCK A | CIRCUIT BLOCK B | CIRCUIT BLOCK C | CIRCUIT BLOCK D | TOTAL |
|---|---|---|---|---|---|
| RESET OPERATION MODE | RESET OPERATION COMPLETION | RESET OPERATION COMPLETION | RESET OPERATION COMPLETION | RESET OPERATION COMPLETION | ✕ |
| RESET OPERATION PARAMETER (FREQUENCY MHz) | 0 | 0 | 0 | 0 | ✕ |
| RESET OPERATION PARAMETER (VOLTAGE V) | 1.1 | 1.1 | 1.1 | 1.1 | ✕ |
| ESTIMATED DYNAMIC POWER DISSIPATION (mW) | 0 | 0 | 0 | 0 | 0 |

SEMICONDUCTOR DEVICE AND METHOD OF CONTROLLING THE SAME

BACKGROUND OF THE INVENTION

Field of the Invention

The present invention relates to a semiconductor device comprising a plurality of circuit blocks.

Description of the Related Art

In recent years, semiconductor integrated circuits are required to reduce power dissipation because of a trend toward energy saving considering environmental problems. In general, the power dissipation of a semiconductor integrated circuit formed from logic gates is roughly divided into dynamic power dissipation and static power dissipation.

The dynamic power dissipation is power dissipated by current that charge/discharge a wiring capacitance connected to a logic gate and a gate capacitance at the subsequent stage. The dynamic power dissipation can be reduced by suppressing a signal change. For example, when clock supply to a flip-flop without a signal change is suspended by clock gating, the dynamic power dissipation can be reduced.

On the other hand, the static power dissipation is power dissipated by the leakage current of a transistor in the off state and does not depend on the operating frequency. In general, power dissipation by a junction leakage current, a gate leakage current, a gate-induced drain leakage current, and a subthreshold leakage current are categorized into the static power dissipation.

The static power dissipation by these leakage currents can be suppressed by shutting down power supply (to be referred to as "power shutdown" hereinafter) to some circuit blocks of the semiconductor integrated circuits. When recovering the circuit blocks that have undergone the power shutdown to a normal operation, it is necessary to resume power supply to the circuit block and then perform initialization. Hence, reset is performed before the circuit blocks return to the normal operation.

During the reset operation, since a signal change is actively caused in a storage element such as a flip-flop in each circuit block, clock gating is not performed during the reset operation. For this reason, the power dissipation of the circuit blocks during the reset operation is larger than that in the normal operation.

In the recent semiconductor integrated circuits, the number of power shutdown target regions (to be referred to as "power domains" hereinafter, and for example, circuit blocks) tends to increase. When the plurality of circuit blocks configured to implement the functions of a semiconductor integrated circuit are arranged in different power domains, it is possible to shut down power to power domains where circuit blocks having functions that are not to be used. Unnecessary static power dissipation can thus be reduced.

Each power domain needs the reset operation (especially cancel of the reset signal) after resumption of power supply. In a general semiconductor integrated circuit, when a plurality of circuit blocks are to be reset, the circuit block unit reset operations (reset signal issuance timings or cancel timings) are synchronized to raise the processing efficiency of the entire circuit. Hence, when the reset operations overlap in the plurality of power domains, the power dissipation instantaneously increases during the reset operations.

There is proposed a technique of reducing power dissipation by dividing the frequency of clocks input to circuit blocks and lowering the operating frequency of the circuit blocks during the reset operations. There is also proposed a technique of distributing the degree of increase in power dissipation by inputting clocks to a plurality of circuit blocks at different timings.

However, to complete the reset operations of the circuit blocks, clocks as many as a predetermined number of cycles need to be input. According to the technique of lowering the operating frequency of circuit blocks, the period required for the reset operations becomes long because the operating frequency lowers, although the peak of power dissipation can be reduced to some extent. According to the technique of changing the clock timing, the frequency of clocks input to the circuit blocks is not lowered. However, the period required for the reset operations becomes long as well because the timing of input clocks changes.

SUMMARY OF THE INVENTION

In one aspect, a semiconductor device comprising: a plurality of circuit blocks, each of which performs an assigned operation, and performs a reset operation in a case where recovering from a shutdown state of power supply; a power control unit configured to control power supply to a power domain comprising at least one circuit block; and an initialization control unit configured to control reset operation parameters of the plurality of circuit blocks as reset operation targets, for which power supply is resumed by the power control unit, so as to meet a power condition that makes power dissipation of the semiconductor device by the reset operation not more than a predetermined power.

According to the aspect, it is possible to suppress the power dissipation of a semiconductor device in the reset operations of a plurality of circuit blocks and prevent the reset period from becoming long.

Further features of the present invention will become apparent from the following description of exemplary embodiments with reference to the attached drawings.

BRIEF DESCRIPTION OF THE DRAWINGS

FIG. 5 is a view showing an example of a reset operation parameter table according to the first embodiment.

FIGS. 6A to 6D are views showing an example of transition of a reset operation parameter according to the first embodiment.

FIG. 8 is a timing chart of a reset operation according to the first embodiment.

FIG. 10 is a view showing an example of a reset operation parameter table according to the second embodiment.

FIGS. 11A to 11E are views showing an example of transition of a reset operation parameter according to the second embodiment.

DESCRIPTION OF THE EMBODIMENTS

Semiconductor devices according to preferred embodiments of the present invention and methods of controlling the same will now be described in detail with reference to the accompanying drawings. Note that the components described in the following embodiments are merely examples, and the present invention is not limited to the illustrated components.

First Embodiment

[Arrangement of Semiconductor Device]

Figure 1:
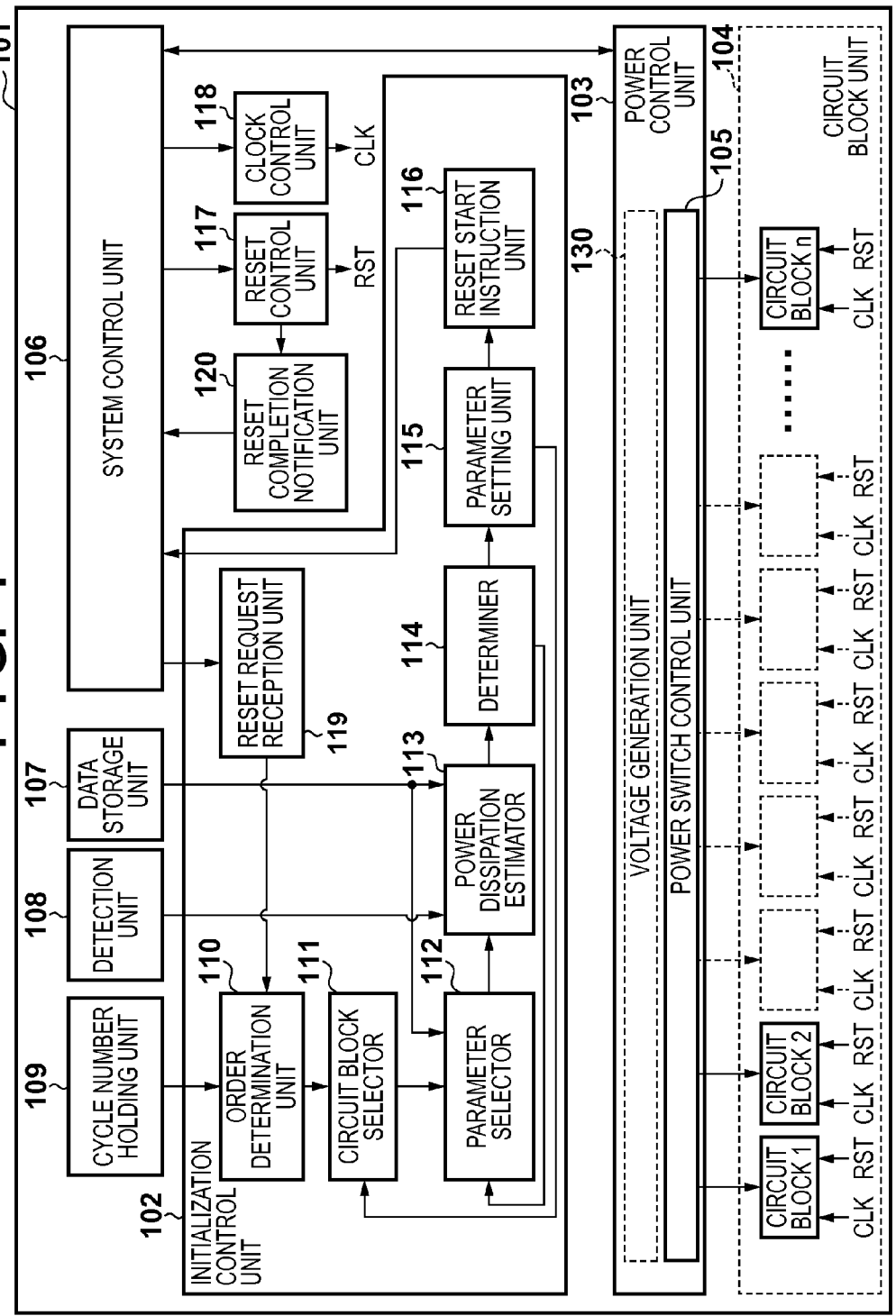
FIG. 1 is a block diagram showing the internal arrangement of a semiconductor integrated circuit according to the first embodiment.

A semiconductor integrated circuit 101 that is a semiconductor device according to an embodiment of the present invention will be described first. FIG. 1 is a block diagram showing the internal arrangement of the semiconductor integrated circuit 101.

The semiconductor integrated circuit 101 comprises a circuit block unit 104 formed from n (n≥2) circuit blocks corresponding to different power domains, respectively. Each circuit block performs an operation in accordance with a supplied clock CLK, thereby implementing a function assigned in advance or dynamically. During supply of a reset signal RST, each circuit block continuously resets an internal storage element such as a flip-flop.

A power control unit 103 causes a power switch control unit 105 to switch between power supply from a power source and power shutdown for each circuit block of the circuit block unit 104. A detection unit 108 detects information representing an operation state such as the temperature, voltage, and current of the semiconductor integrated circuit 101.

A data storage unit 107 holds various tables and data to be described below. The data storage unit 107 holds, for each circuit block, (a) a required-number-of-cycles table to be described later and (b) a table showing a plurality of reset operation parameter candidates when performing a reset operation at the time of power supply resumption and dynamic power dissipation corresponding to the candidates. The data storage unit 107 also stores (c) a power dissipation value serving as a reference to stably operate the semiconductor integrated circuit 101, (d) a table showing the relationship between a chip temperature and static power dissipation, and (e) a table showing the relationship between the power dissipation and an increase in the chip temperature of the semiconductor integrated circuit 101.

A system control unit 106 instructs the power control unit 103 to do power shutdown or power recovery of the power domains and receives a power recovery completion notification of the power domains from the power control unit 103. Note that in this embodiment, the circuit blocks and the power domains are in a one-to-one correspondence. The system control unit 106 instructs reset operation target circuit blocks to a reset request reception unit 119 of an initialization control unit 102, and receives a reset start instruction from a reset start instruction unit 116 of the initialization control unit 102. The system control unit 106 sends an instruction concerning reset of the circuit blocks to a clock control unit 118 and a reset control unit 117, and receives a reset completion notification from a reset completion notification unit 120. The system control unit 106 also functions as a sequencer that controls the entire system by controlling, for example, the transition of the power mode of the semiconductor integrated circuit 101 or the data processing mode of each circuit block.

In correspondence with each circuit block, a cycle number holding unit 109 holds, as a table, the number of cycles (to be referred to as the "required number of cycles" hereinafter) of clocks that need to be input until completion of the reset operation.

The initialization control unit 102 receives an instruction from the system control unit 106, and after that, determines the operating frequency or operating voltage as a reset operation parameter for each circuit block. The clock control unit 118 controls based on an instruction from the system control unit 106 whether to supply the clock CLK to each circuit block. Based on an instruction from the system control unit 106, the reset control unit 117 issues the reset signal RST to the circuit blocks or stop the issued reset signal RST, thereby controlling the start/end of the reset operation of each circuit block.

Initialization Control Unit

The arrangement of the initialization control unit 102 will be described below.

Based on an instruction from the system control unit 106, the reset request reception unit 119 notifies an order determination unit 110 of circuit blocks (to be referred to as "designated circuit blocks" hereinafter) designated as the reset operation targets. The order determination unit 110 reads out, from the cycle number holding unit 109, the required number of cycles of each designated circuit block notified by the reset request reception unit 119, and determines the priority order of reset operation in accordance with the magnitude of the readout required number of cycles.

A circuit block selector 111 selects a circuit block as a reset operation parameter setting target in accordance with the priority order determined by the order determination unit 110. A parameter selector 112 selects reset operation parameter candidates (operating frequency or operating voltage) of the circuit block selected by the circuit block selector 111 from a predetermined selection target group.

A power dissipation estimator 113 estimates the power dissipation of the semiconductor integrated circuit 101 when performing the reset operation by the reset operation parameter candidates selected by the parameter selector 112. The estimation processing will be described later.

A determiner 114 determines whether the power dissipation estimated by the power dissipation estimator 113 meets a power condition equal to or less than predetermined reference power dissipation. A parameter setting unit 115 sets the reset operation parameter candidates upon determining that the power dissipation meets the power condition in a register (not shown) that controls the reset operation as reset operation parameters to be applied to the actual reset operation.

The reset start instruction unit 116 determines whether the setting of the register that controls the reset operation of a designated circuit block is completed. When register setting is completed for all designated circuit blocks, the reset start instruction unit 116 notifies the system control unit 106 of a reset start instruction representing it.

Note that FIG. 1 shows an example in which the number of circuit blocks is n. However, the present invention is applicable when there exist a plurality of power control targets, and the number of circuit blocks is not particularly limited. An example in which the circuit blocks and the power domains are in a one-to-one correspondence will be explained for the descriptive convenience. However, they need not always in a one-to-one correspondence. For example, two or more circuit blocks may correspond to one power domain, or one circuit block may be managed by two or more power domains. The power domain here indicates a region where switching between power supply and power shutdown can be done by the same power control element (for example, power switch) and is used to suppress the leakage current of the semiconductor integrated circuit 101. The power domain may be a circuit block, a functional module, an IC, or the like that meets this definition.

[Basic Processing of Power Control]

Figure 16:
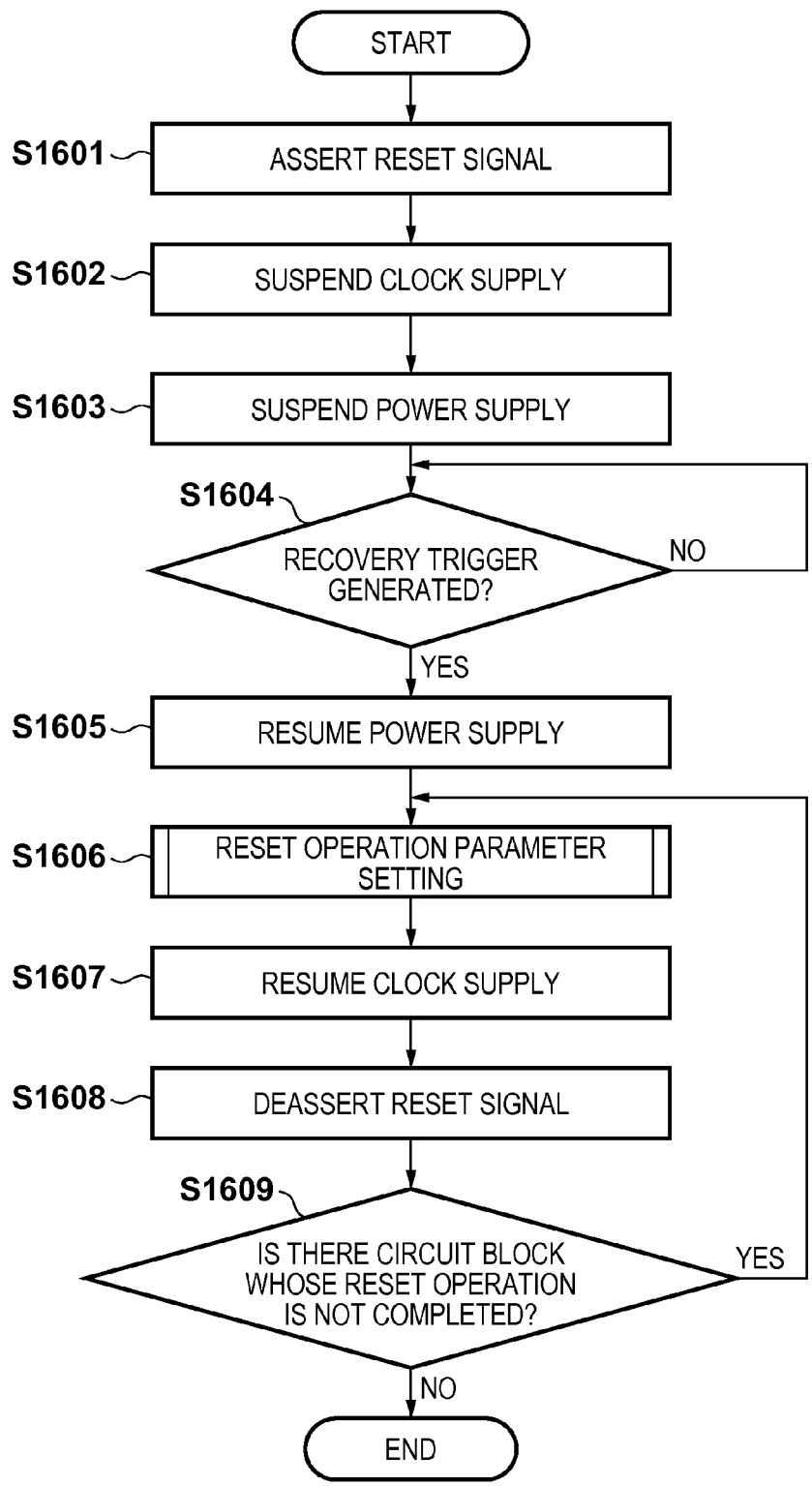
FIG. 16 is a flowchart showing the basic operation of power control according to the first embodiment.

The basic operation (power shutdown operation and power recovery operation) of power control for each circuit block of the semiconductor integrated circuit 101 shown in FIG. 1 will be described below with reference to the flowchart of FIG. 16.

First, in accordance with an instruction to shut down power to a power shutdown target circuit block (to be referred to as a "shutdown target block" hereinafter), the system control unit 106 instructs the reset control unit 117 to set the reset signal RST to the shutdown target block in an active state. In accordance with this instruction, the reset control unit 117 asserts the reset signal RST for the shutdown target block and starts the reset operation (S1601).

Next, the system control unit 106 instructs the clock control unit 118 to suspend supply of the clock CLK to the shutdown target block. In accordance with this instruction, the clock control unit 118 activates a clock gate cell (not shown), thereby suspending clock supply to the shutdown target block (S1602).

The system control unit 106 transmits a command (to be referred to as a "shutdown request" hereinafter) to request power shutdown of the shutdown target block to the power control unit 103. After receiving the shutdown request, the power control unit 103 causes the power switch control unit 105 to do power shutdown of the shutdown target block (S1603).

The system control unit 106 determines whether a trigger (to be referred to as a "recovery trigger" hereinafter) to recover the circuit block (to be referred to as a "power shutdown block" hereinafter) in the power shutdown state is generated (S1604). An example of the recovery trigger is reception of a request from the user, an application program, or the like by the semiconductor integrated circuit 101. Until the recovery trigger is generated, the system control unit 106 repeats the determination of step S1604. Upon determining that the recovery trigger is generated, the process advances to step S1605 to start a power recovery operation.

When the recovery trigger is generated, the system control unit 106 transmits, to the power control unit 103, a command (to be referred to as a "recovery request" hereinafter) to request resumption of power supply to the power shutdown block. After receiving the recovery request, the power control unit 103 causes the power switch control unit 105 to cancel power shutdown of the power shutdown block and resume power supply (S1605). After completion of charging of the power shutdown block, the process advances to step S1606.

As initialization control processing for each of the circuit blocks (to be referred to as "reset target blocks" hereinafter) as the reset operation targets, the initialization control unit 102 sets a reset operation parameter (operating frequency or operating voltage) and notifies the system control unit 106 of the set values. The initialization control processing of the initialization control unit 102 will be described later. Upon receiving the notification, the system control unit 106 outputs a start request (to be referred to as a "reset start instruction" hereinafter) of the reset operation of the reset target block to the clock control unit 118 and the reset control unit 117 (S1606).

Upon receiving the reset start instruction, the clock control unit 118 disables gating of a clock gate cell (not shown), thereby resuming clock supply to the reset target block (S1607). Note that the control pin of the clock gate cell remains in the disable state to supply the clocks until the reset of the reset target block is canceled. That is, the clock control unit 118 continuously supplies the clocks to the reset target block at least during the time from reception of the reset start instruction to cancel of the reset.

After the clocks are continuously supplied to the reset target block for a predetermined period (reset period) from the reception of the reset start instruction, the reset control unit 117 deasserts the reset signal RST for the reset target block and cancel the reset (S1608). Note that a counter circuit or the like is usable to measure the reset period. When a value according to the circuit scale of the circuit block is preset as the counter value, the reset period can be controlled.

After the cancel of the reset period, the reset target block is set in a state capable of starting the normal operation. Note that the reset cancel notification to the system control unit 106 is done by a reset completion notification issued by the reset completion notification unit 120 that has received a notification from the reset control unit 117 upon detecting the reset completion of the circuit block.

The system control unit 106 determines whether there exists a reset target block whose reset operation is not completed (S1609). If a reset target block whose reset operation is not completed exists, the processes of steps S1606 to S1608 are repeated. If there is no reset target block whose reset operation is not completed, the processing ends.

[Initialization Control Processing]

The initialization control processing of the initialization control unit 102 will be described below. A case where four circuit blocks A, B, C, and D are designated as the reset target blocks will be exemplified below for the convenience.

Figure 2:
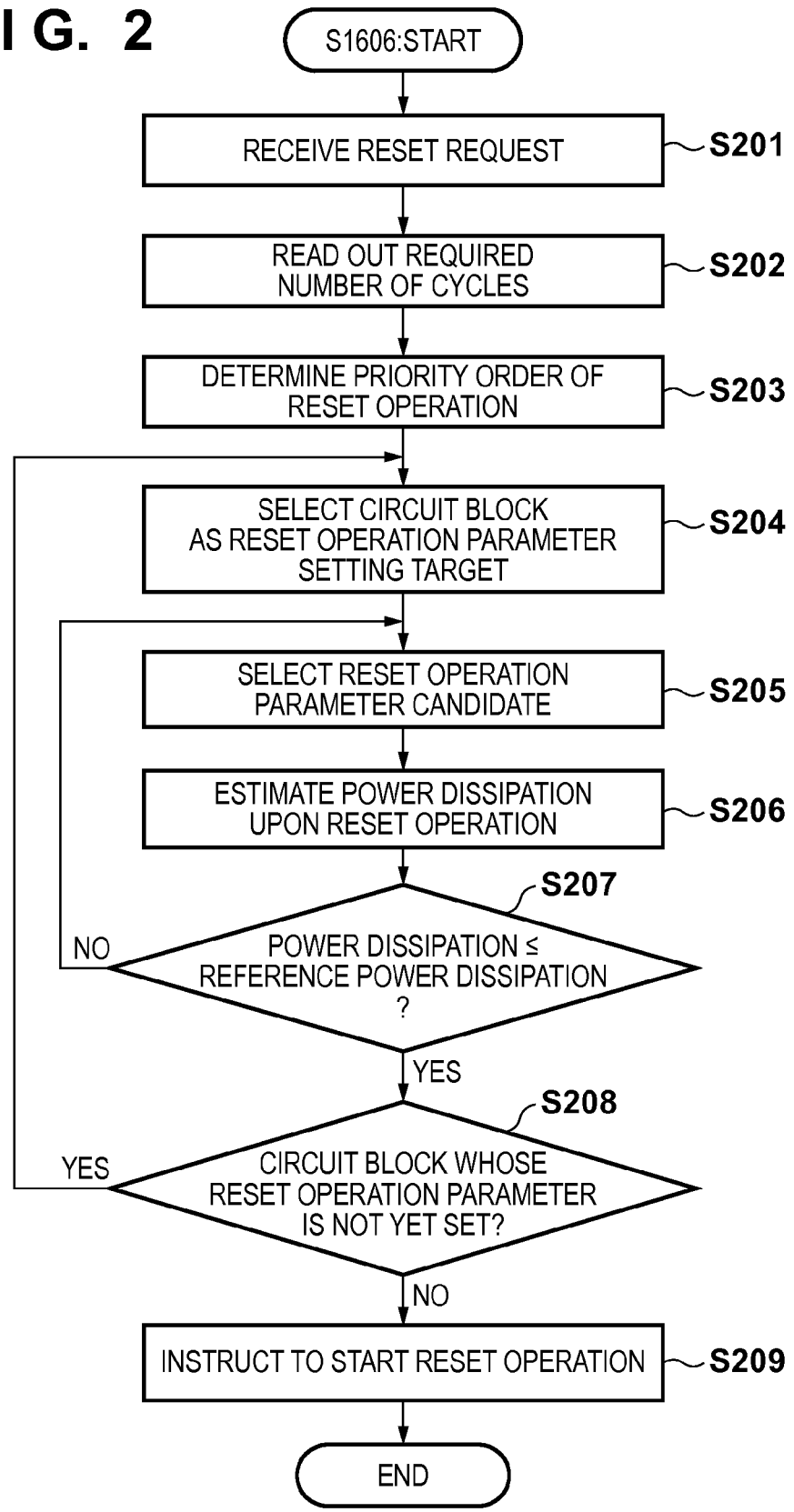
FIG. 2 is a flowchart showing initialization control processing according to the first embodiment.
Figures 3, 4:
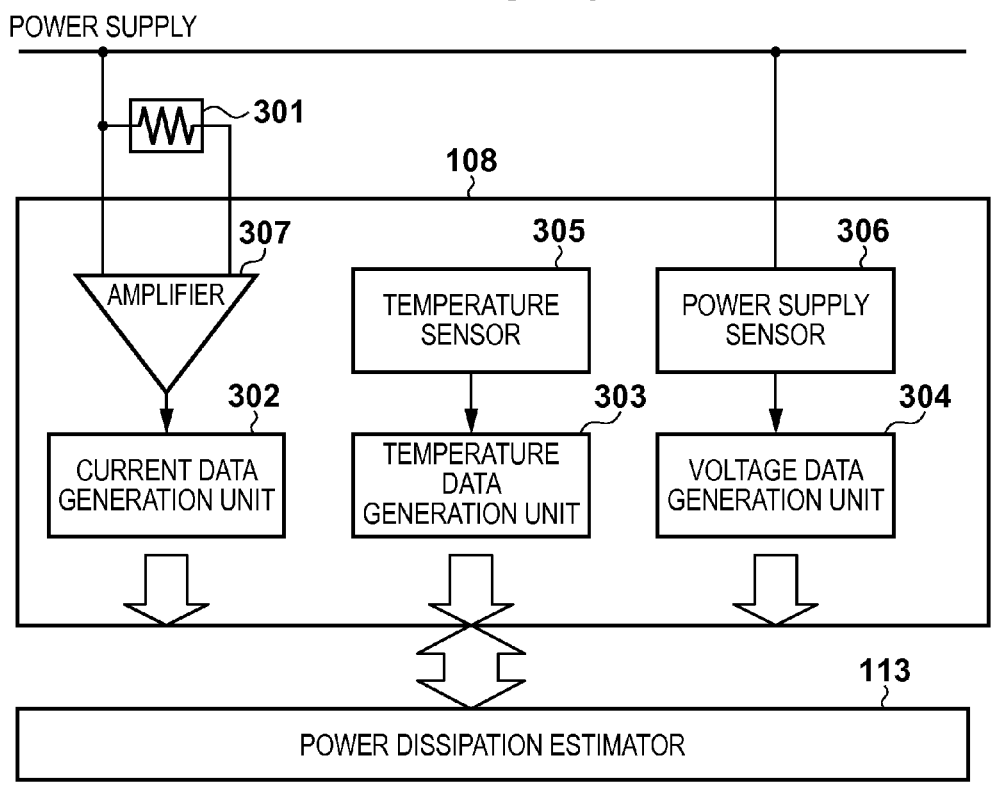
FIG. 3 is a block diagram showing the arrangement of a detection unit.
FIG. 4 is a view showing an example of a required-number-of-cycles table.

FIG. 2 is a flowchart showing the initialization control processing (S1606). Upon receiving a command (to be referred to as a "reset request" hereinafter) to request the reset operations of the circuit blocks A, B, C, and D from the system control unit 106, the reset request reception unit 119 notifies the order determination unit 110 of the reset request (S201). The order determination unit 110 reads out the required numbers of cycles for the reset operations of the circuit blocks A, B, C, and D from the cycle number holding unit 109. FIG. 4 shows an example of the required-number-of-cycles table of the circuit blocks, which is held by the cycle number holding unit 109.

Figure 9A:
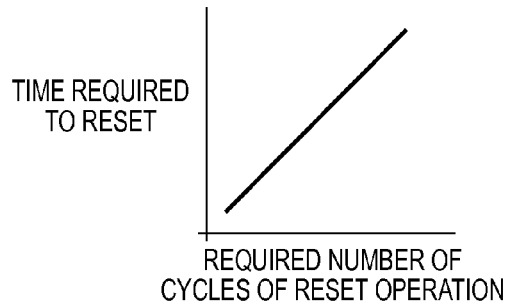
FIGS. 9A to 9F are graphs showing a time required to reset and the characteristic of power dissipation.

The order determination unit 110 determines the priority order of reset operation of each of the circuit blocks A, B, C, and D in accordance with the magnitude of the required number of cycles (S203). FIGS. 9A to 9F show the relationships between the time required to reset or power dissipation in the reset operation and the required number of cycles, the operating frequency, the operating voltage, and the chip temperature. Note that the tables shown in FIGS. 9A to 9F are stored in the data storage unit 107. As shown in FIG. 9A, the time required to reset increases in proportion to the required number of cycles. Hence, when the reset operations of a plurality of circuit blocks are performed at the same timing, a circuit block having a large required number of cycles becomes a bottleneck, and the period of the whole reset operations becomes long. To prevent this, the order determination unit 110 determines the priority order so as to give a priority to the reset operation of the circuit block that has the large required number of cycles and can be a bottleneck. According to the required numbers of cycles shown in FIG. 4, the priority order of reset operation becomes lower in the order of circuit blocks B, A, C, and D.

The circuit block selector 111 selects a circuit block as the reset operation parameter setting target (S204). When selecting a circuit block, a circuit block having a high priority order of reset operation is preferentially selected. Hence, the circuit block B is selected first.

Figure 9B:
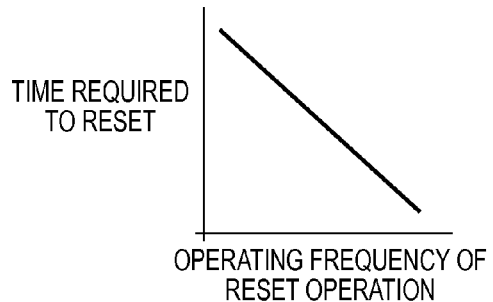
Figure 9C:
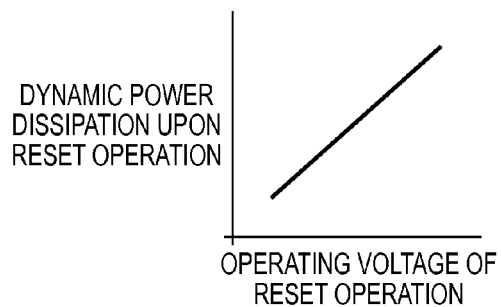
Figure 9D:
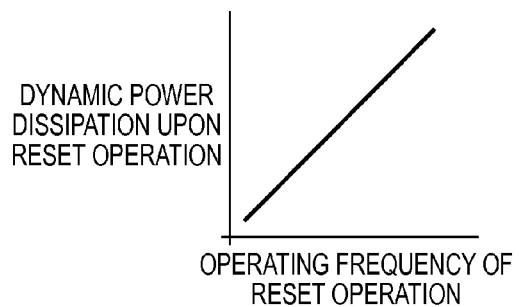

The parameter selector 112 selects the reset operation parameter candidate of the selected circuit block by looking up the reset operation parameter table (S205). As the reset operation parameters, the operating frequency, the operating voltage, and the like are usable. A case where only the operating frequency is set will be exemplified below. FIG. 5 shows an example of the reset operation parameter table. The reset operation parameter table is held by the data storage unit 107 in advance. The reset operation parameter candidate is selected from the reset operation parameters as the selection target group recorded in the reset operation parameter table. The higher the operating frequency of the reset operation is, the shorter the time required to reset is, as shown in FIG. 9B, but the larger the dynamic power dissipation is, as shown in FIG. 9D. To quickly complete the reset operation, a high operating frequency is set. Hence, an operating frequency of 200 MHz for high speed shown in FIG. 5 is selected as the reset operation parameter candidate of the circuit block B. Note that a reset operation parameter that makes the time required to reset shortest is selected for each circuit block within the range of power dissipation assignable to each circuit block.

Next, the power dissipation estimator 113 estimates the power dissipation of the entire semiconductor integrated circuit 101 when performing the reset operation using the currently selected reset operation parameter (S206). For example, the power dissipation estimator 113 estimates the power dissipation of the semiconductor integrated circuit 101 when performing the reset operation of the circuit block B selected in step S204 using the reset operation parameter candidate (frequency of 200 MHz) selected in step S205. This estimation is done by adding an increase in the power dissipation that is estimated to be caused by the reset operation to the power dissipation of the semiconductor integrated circuit 101 before the start of the reset operation. The increase in the power dissipation to be caused by the reset operation is obtained as the sum of an increase in the static power dissipation and an increase in the dynamic power dissipation. Hence, a value obtained by adding the increase in the dynamic power dissipation and the increase in the static power dissipation caused by performing the reset operation of the circuit block B at a frequency of 200 MHz to the power dissipation before the start of the reset operation is calculated as the power dissipation of the semiconductor integrated circuit 101 at the time of the reset operation.

The power dissipation estimation processing of the power dissipation estimator 113 will be described here. First, the power dissipation estimator 113 acquires the estimated value of the dynamic power dissipation at the time of the reset operation of the estimation target circuit block from the reset operation parameter table shown in FIG. 5, and adds the estimated values of the dynamic power dissipation of the circuit blocks, thereby calculating the increase in the dynamic power dissipation.

Figure 9E:
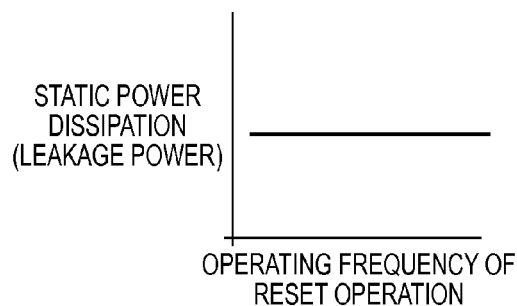
Figure 9F:
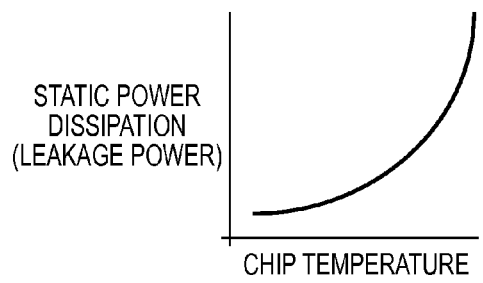

Next, the power dissipation estimator 113 estimates an increase in the chip temperature corresponding to the increase in the dynamic power dissipation by looking up the relationship between the power dissipation and the increase in the chip temperature stored in the data storage unit 107. The power dissipation estimator 113 also acquires temperature data corresponding to the chip temperature before the reset operation from the detection unit 108. The power dissipation estimator 113 then estimates the increase in the static power dissipation from the chip temperature before the reset operation and the estimated value of the increase in the chip temperature by looking up the chip temperature vs. static power dissipation characteristic table shown in FIG. 9F. Note that as shown in FIGS. 9E and 9F, the static power dissipation does not depend on the operating frequency of the reset operation but exponentially increases depending on the chip temperature. Detection of the chip temperature, current, and voltage of the detection unit 108 will be described later.

The power dissipation estimator 113 calculates the power dissipation before the reset operation from the output data (current data and voltage data) of the detection unit 108. The power dissipation estimator 113 adds the increase in the static power dissipation and the increase in the dynamic power dissipation to the power dissipation before the reset operation, thereby calculating the power dissipation at the time of the reset operation.

Various data held by the data storage unit 107 is set by firmware control in advance after Power On Reset upon powering on the semiconductor integrated circuit 101 is canceled. To change the data held by the data storage unit 107 after power on, the data are rewritten by firmware control as needed.

Next, the determiner 114 determines the power condition (whether the power dissipation estimated in step S206 is equal to or less than a predetermined reference power dissipation of the semiconductor integrated circuit 101) (S207). If estimated power dissipation≤reference power dissipation, the process advances to step S208. If estimated power dissipation>reference power dissipation, the process returns to step S205, and the parameter selector 112 reselects the reset operation parameter. At the time of reselection, the reset operation parameter is selected such that the increase in the dynamic power dissipation caused by the reset operation decreases.

For example, if the estimated power dissipation when performing the reset operation of the circuit block B at an operating frequency of 200 MHz exceeds the reference power dissipation, an operating frequency of 100 MHz for medium speed shown in FIG. 5 is reselected. If the estimated power dissipation is still larger than the reference power dissipation, an operating frequency of 50 MHz for low speed shown in FIG. 5 is reselected. If the estimated power dissipation is still larger than the reference power dissipation, the circuit block B is determined to be unable to perform the reset operation within the assignable power dissipation. An operating frequency of 0 MHz for actually prohibiting the reset operation is selected, and the process advances to step S208. The reference power dissipation is an index (power value) for the stable operation of the semiconductor integrated circuit 101. A current value (specified current) or the like may be used as the index if the value can be derived from power as an index for the stable operation of the semiconductor integrated circuit 101.

Next, the parameter setting unit 115 sets the reset operation parameter candidate selected in step S205 in a reset operation control register (not shown) as a reset operation parameter to be actually applied, and determines whether there exists a circuit block whose reset operation parameter is not yet set at this point of time. If there exists a circuit block whose reset operation parameter is not yet set, the parameter setting unit 115 returns the process to step S204 to repeat the above-described reset operation parameter setting processing for the circuit block. If there exists no circuit block whose reset operation parameter is not yet set, the process advances to step S209. That is, the reset operation parameter of the circuit block B is set first in accordance with the priority order. The process then returns to step S204 to set the reset operation parameter in the order of circuit blocks A, C, and D.

When the reset operation parameter setting has ended for all reset target blocks, the reset start instruction unit 116 requests the system control unit 106 to start the reset operations of the reset target blocks using the set reset operation parameters. From then on, the system control unit 106 starts the reset operations of the reset target blocks by controlling the clock control unit 118 and the reset control unit 117 in response to the reset operation start request. Only the circuit blocks for which valid operating frequencies are set as the reset operation parameters by the determination of step S207 start the actual reset operations.

[Example of Reset Transition]

The transition of the above-described reset processing of the circuit blocks A, B, C, and D will be described below with reference to FIGS. 6A to 6D and 7. A restriction is assumed to exist here so that the increase in the dynamic power dissipation needs to be suppressed to 220 mW or less to make the power dissipation of the semiconductor integrated circuit 101 equal to or less than the reference power dissipation. The required numbers of cycles, the reset operation parameters, and the estimated values of the dynamic power dissipation at the time of the reset operation are assumed to comply with the tables shown in FIGS. 4 and 5.

Figure 7:
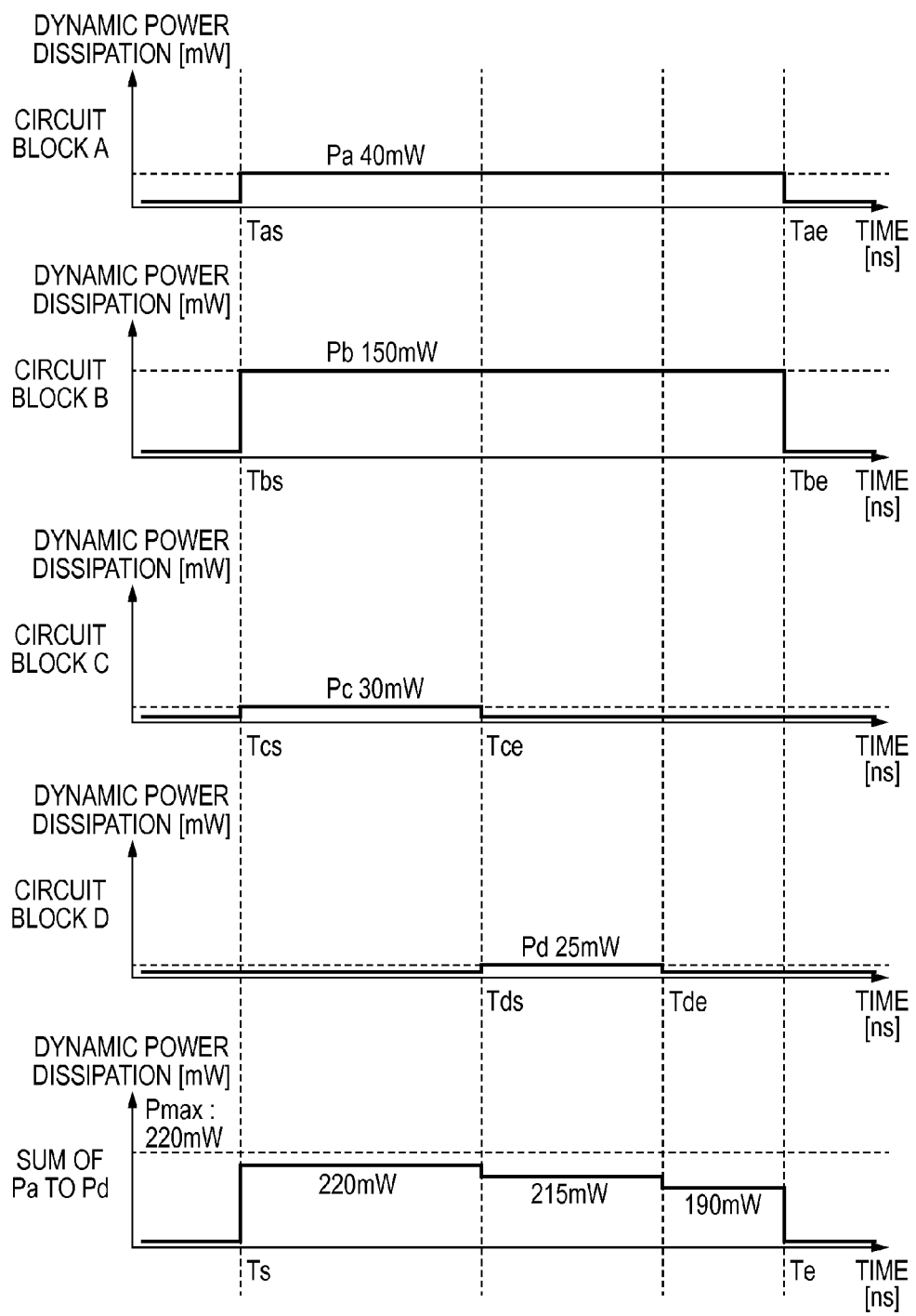
FIG. 7 is a timing chart showing an example of transition of an increase in dynamic power dissipation according to the first embodiment.

FIGS. 6A to 6D are views showing how the reset operation parameters transit until the reset operations of all the circuit blocks A, B, C, and D are completed. FIG. 7 is a timing chart showing how the increase in the dynamic power dissipation transits according to the transition of the reset operation parameters. Note that Ts and Te in FIG. 7 represent the start and end timings of the reset operation. Additionally, for example, Tas and Tae represent the reset start and end timings of the circuit block A. This also applies to the circuit blocks B, C, and D. For example, Tbs and Tbe represent the reset start and end timings of the circuit block B.

First, as shown in FIG. 6A, initial reset operation parameters are set at the timing Ts. More specifically, since the reset operation mode of the circuit block B having the highest priority order is set to "high speed", the dynamic power dissipation is estimated as 150 mW for the reset operation parameter table shown in FIG. 5. Since the remainder of the increase in the dynamic power dissipation is 70 mW (=220−150), a "medium speed" mode in which the estimated dynamic power dissipation is 40 mW is set for the circuit block A having the second highest priority order. A "medium speed" mode in which the estimated dynamic power dissipation is 30 mW is set for the circuit block C having the third highest priority order as well. The sum of estimated dynamic power dissipation already reaches 220 mW. Hence, even a "low speed mode" cannot be set for the circuit block D having the fourth highest priority order. Instead, a reset operation parameter (0 MHz) that causes no reset operation is set.

Next, as shown in FIG. 6B, the reset operation of the circuit block C ends at the timing Tce. Upon receiving the reset completion notification of the circuit block C from the reset completion notification unit 120, the system control unit 106 instructs the clock control unit 118 to suspend clock supply to the circuit block C, and transmits a reset request excluding the circuit block C to the reset request reception unit 119. The initialization control unit 102 thus updates the reset operation parameters as follows.

Since the estimated dynamic power dissipation (30 mW) of the circuit block exists no longer, the reset operation parameter of the circuit block D can be set at this timing, and a "medium speed" mode in which the estimated dynamic power dissipation is 25 mW is set. That is, the reset end timing Tce of the circuit block C is the reset start timing Tds of the circuit block D.

As shown in FIG. 6C, the reset operation of the circuit block D ends at the timing Tde. The reset operations of the circuit blocks A and B continue. As shown in FIG. 6D, the reset operations of all the reset target blocks end at the reset end timings Tae and Tbe of the circuit blocks A and B (end timing Te).

As described above, the reset operation of a circuit block having a large required number of cycles is preferentially performed at a high operating frequency. This makes it possible to suppress the power dissipation to the limit value and prevent the reset period from becoming long.

FIG. 8 shows an example of a timing chart when performing the reset operations of the circuit blocks A, B, C, and D according to the transition of the reset operation parameters shown in FIGS. 6A to 6D. When power recovery starts, and a power recovery completion notification is issued, it becomes the reset operation start timing Ts. First, the clocks of the operating frequencies are input to the circuit blocks A, B, and C. At the timing Tce, the reset operation of the circuit block C ends, the reset completion notification of the circuit block C is issued, and clock supply to the circuit block C suspends.

Next, the clocks of the operating frequency are input to the circuit block D. At the timing Tde, the reset operation of the circuit block D ends, the reset completion notification of the circuit block D is issued, and clock supply to the circuit block D suspends. At the timing Tde, the reset operations of the circuit blocks A and B are continuing. After that, at the timings Tae and Tbe, the reset operations of the circuit blocks A and B end, the reset completion notifications of the circuit blocks A and B are issued, and clock supply to the circuit blocks A and B suspends (reset end timing Te). Then, the reset signals RST of the circuit blocks A, B, C, and D are canceled, and the normal operations of the circuit blocks A, B, C, and D are enabled.

[Detection Unit]

The arrangement and operation of the detection unit 108 will be described below. The detection unit 108 detects not only the current and voltage data of the semiconductor integrated circuit 101 but also the temperature.

FIG. 3 is a block diagram showing the arrangement of the detection unit 108. Referring to FIG. 3, a current value detected by a sense resistor 301 is amplified by an amplifier 307, converted into current data by analog/digital (A/D) conversion of a current data generation unit 302, and output to the power dissipation estimator 113. Note that the amplifier 307 may be omitted if the current value detected by the sense resistor 301 is sufficiently large.

A temperature sensor 305 detects the temperature (chip temperature) of the semiconductor integrated circuit 101. The detected temperature is also converted into temperature data by A/D conversion of a temperature data generation unit 303, and output to the power dissipation estimator 113.

A power supply sensor 306 detects various power supply voltages of the semiconductor integrated circuit 101. The detected power supply voltages are converted into voltage data by A/D conversion of a voltage data generation unit 304, and output to the power dissipation estimator 113. Note that the output from the detection unit 108 to the power dissipation estimator 113 is done in response to the request from the power dissipation estimator 113 in step S206 of FIG. 2.

As described above, during the reset operations of a plurality of circuit blocks of the semiconductor integrated circuit 101, the reset operation parameters of the circuit blocks are dynamically set within the range to meet the power condition. This makes it possible to implement an efficient reset operation by suppressing the power dissipation and preventing the reset period from becoming long.

Second Embodiment

A semiconductor device according to the second embodiment of the present invention and a method of controlling the same will be described below. In the above-described first embodiment, only an operating frequency has been explained as the reset operation parameter. In the second embodiment, an example in which an operating frequency and an operating voltage are used as reset operation parameters will be explained. Note that the overall arrangement of a semiconductor integrated circuit 101 according to the second embodiment is almost the same as in FIG. 1 of the above-described first embodiment except that a voltage generation unit 130 shown in FIG. 1 is added in the second embodiment. The basic operation of power control according to the second embodiment is also almost the same as in FIG. 2 of the first embodiment.

[Initialization Control Processing]

Figure 17:
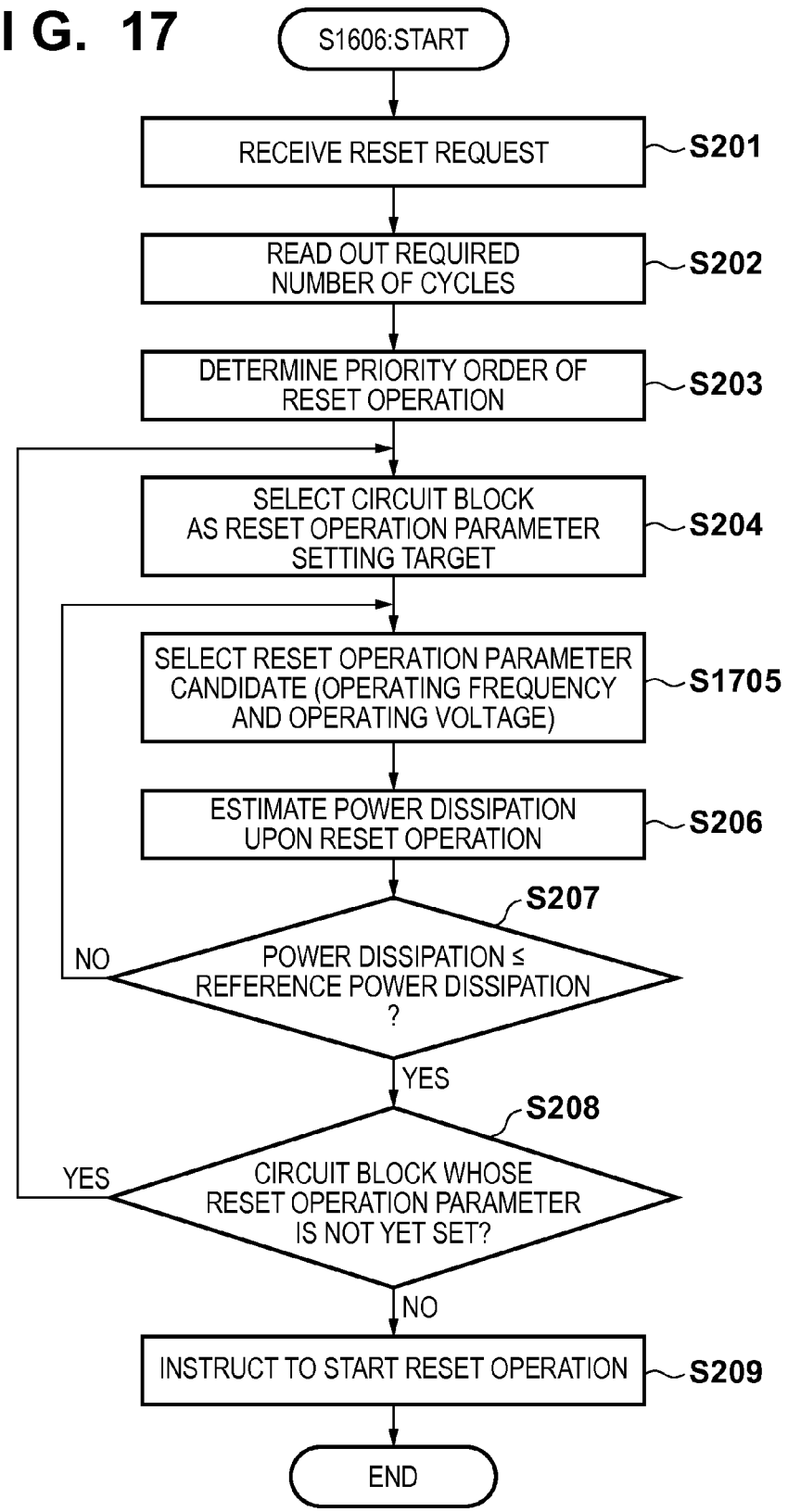
FIG. 17 is a flowchart showing initialization control processing according to the second embodiment.

Initialization control processing (S1606) according to the second embodiment will be described below with reference to the flowchart of FIG. 17. The same step numbers as in FIG. 2 of the first embodiment denote the same processes in FIG. 17, and a description thereof will be omitted. In the second embodiment, when selecting the reset operation parameter candidate in step S1705, an operating voltage is selected in addition to an operating frequency as the reset operation parameters.

Initialization control processing according to the second embodiment is different from that of the first embodiment in the following two points. As the first difference, although only the information of dynamic power dissipation corresponding to an operating frequency is recorded in the reset operation parameter table in the first embodiment, the information of dynamic power dissipation corresponding to a combination of an operating frequency and an operating voltage is recorded in the second embodiment.

FIG. 10 shows an example of the reset operation parameter table of circuit blocks A to D according to the second embodiment. As compared to the example of the table shown in FIG. 5, since the operating voltage is added as a reset operation parameter in addition the operating frequency, "ultrahigh speed" and "ultralow speed" can be set as reset operation modes in addition to "high speed", "medium speed", and "low speed". As shown in FIGS. 10 and 9C, the higher the operating voltage of the reset operation is, the larger the dynamic power dissipation is.

The second difference is the type of register used to set the reset operation parameters. In the first embodiment, only the register (not shown) configured to control the operating frequency is used. In the second embodiment, however, a register configured to control the operating voltage is necessary in addition to the register configured to control the operating frequency. In an actual reset operation, first, an operating voltage generated by the voltage generation unit 130 is applied to a circuit block based on a value set in the register that controls the operating voltage. After that, clocks generated by a clock control unit 118 are supplied to the circuit block based on a value set in the register that controls the operating frequency.

[Example of Reset Transition]

The transition when performing reset processing according to the second embodiment for the circuit blocks A, B, C, and D will be described below with reference to FIGS. 11A to 11E and 12. A restriction is assumed to exist here so that the increase in the dynamic power dissipation needs to be suppressed to 450 mW or less to make the power dissipation of the semiconductor integrated circuit 101 equal to or less than the reference power dissipation. The required numbers of cycles, the reset operation parameters, and the estimated values of the dynamic power dissipation at the time of the reset operation are assumed to comply with the tables shown in FIGS. 4 and 10.

Figure 12:
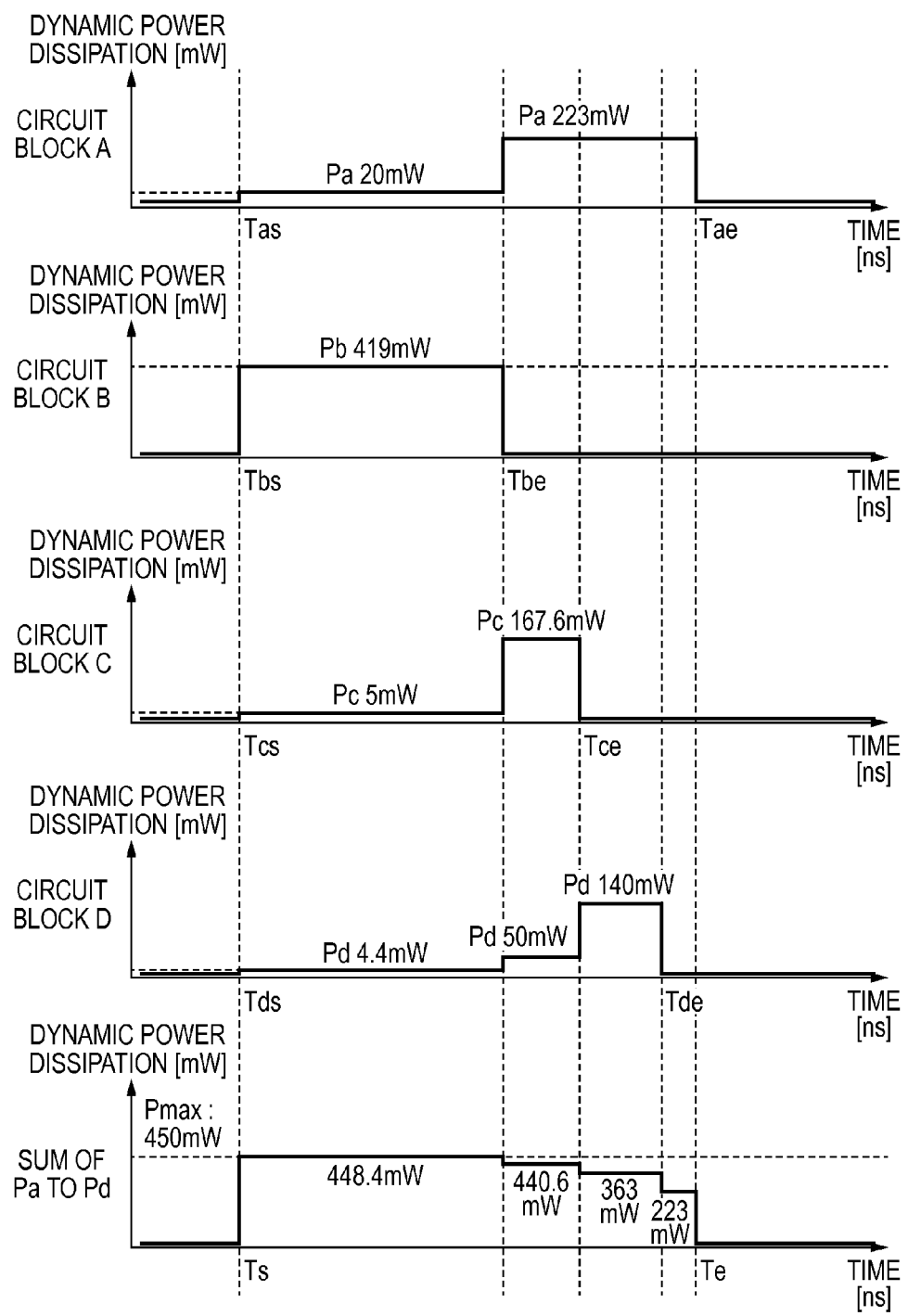
FIG. 12 is a timing chart showing an example of transition of an increase in dynamic power dissipation according to the second embodiment.

FIGS. 11A to 11E are views showing how the reset operation parameters (operating frequency and operating voltage) transit until the reset operations of all the circuit blocks A, B, C, and D are completed. FIG. 12 is a timing chart showing how the increase in the dynamic power dissipation transits according to the transition of the reset operation parameters. According to the second embodiment, the reset operation is performed at a high operating frequency in descending order of required number of cycles of the circuit block, as in the first embodiment. However, the dynamic change of the reset operation mode of each circuit block is controlled more finely than in the first embodiment.

Figure 13:
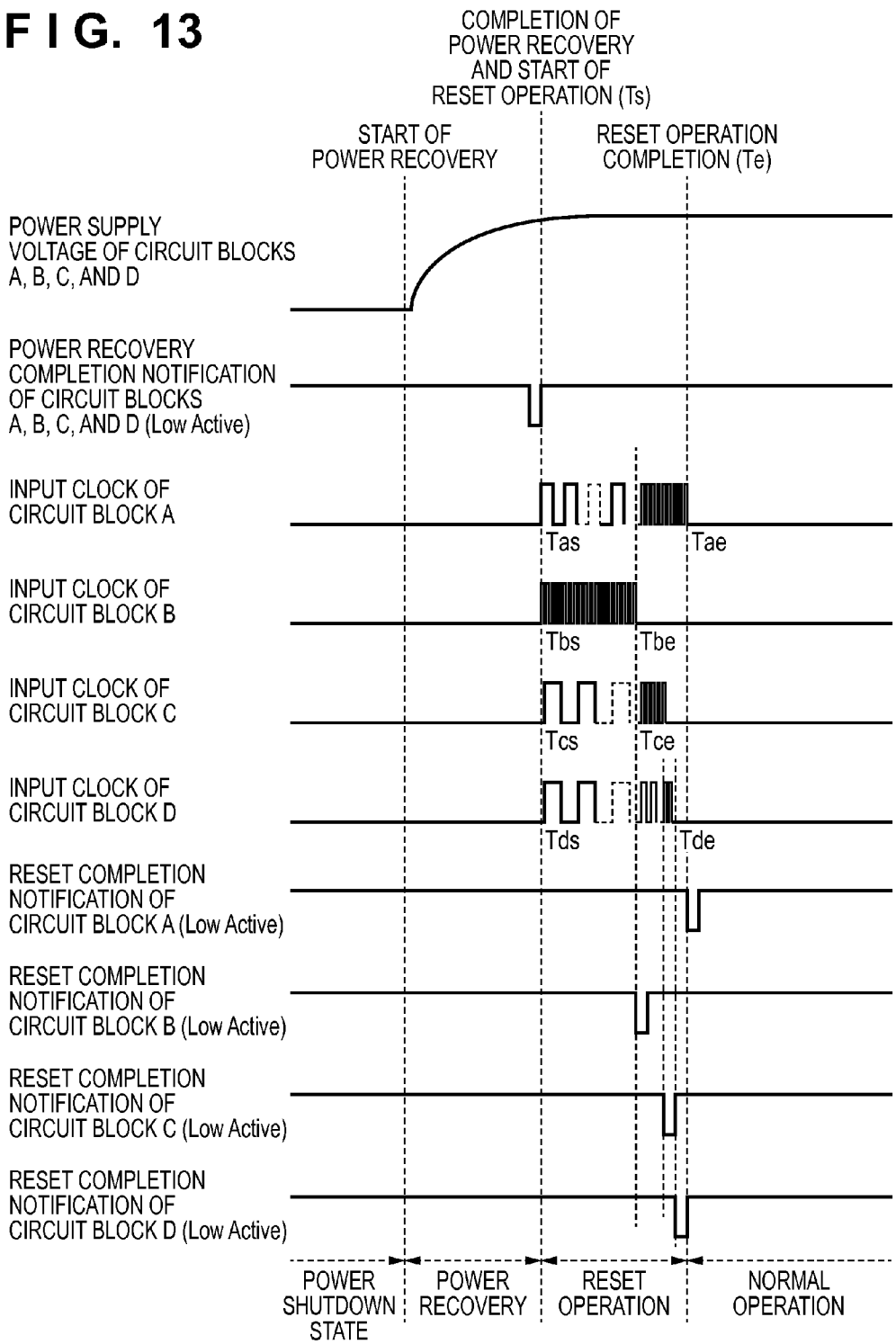
FIG. 13 is a timing chart of a reset operation according to the second embodiment.

FIG. 13 shows an example of a timing chart when performing the reset operations of the circuit blocks A, B, C, and D according to the transition of the reset operation parameters shown in FIGS. 11A to 11E. Deserving special note is that the switching of the reset operation modes comprising the "ultrahigh speed" mode is controlled more finely than in the first embodiment, and this is conspicuous in, for example, the circuit block D. Hence, the period of the reset operation, that is, the overall reset operation period from a timing Ts to Te shortens as compared to the example shown in the timing chart of FIG. 8 according to the first embodiment.

As described above, the operating frequency and the operating voltage are settable as the reset operation parameters. This makes it possible to more finely control the increase amount of the dynamic power dissipation at the time of the reset operation. It is therefore possible to implement a more efficient reset operation by suppressing the power dissipation and preventing the reset period from becoming long.

Third Embodiment

Figure 14:
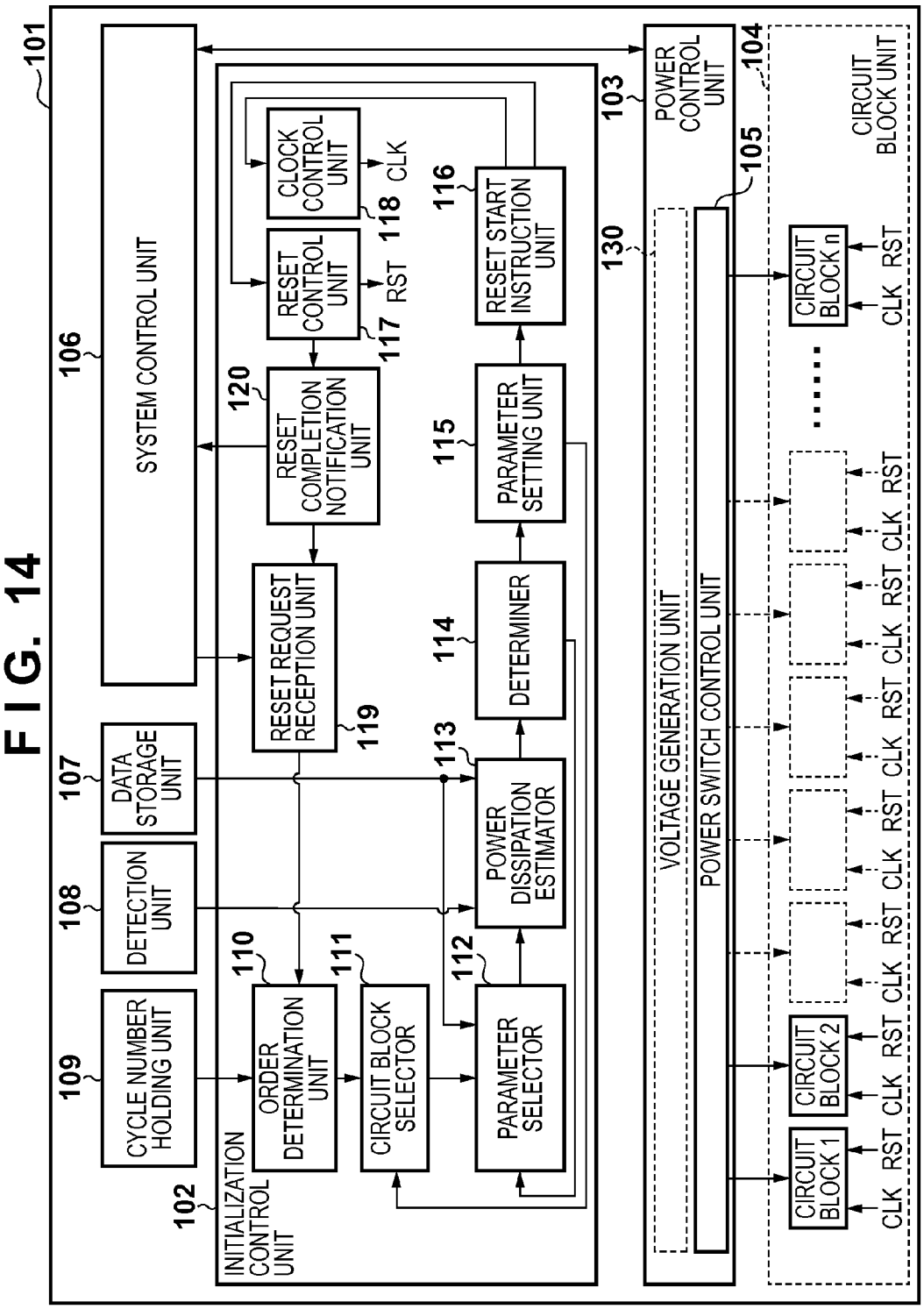
FIG. 14 is a block diagram showing the arrangement of a semiconductor integrated circuit according to the third embodiment.

A semiconductor device according to the third embodiment of the present invention and a method of controlling the same will be described below. FIG. 14 shows the overall arrangement of a semiconductor integrated circuit 101 according to the third embodiment. The same reference numerals as in FIG. 1 denote the same components in FIG. 14, and a description thereof will be omitted.

The arrangement shown in FIG. 14 is different from FIG. 1 in that a reset control unit 117 and a clock control unit 118 are not under the control of a system control unit 106. In the first embodiment, an example has been described in which the system control unit 106 that has received a reset start instruction from the reset start instruction unit 116 of the initialization control unit 102 controls the reset control unit 117 and the clock control unit 118 to perform the reset operation. In the third embodiment, an example in which the reset control unit 117 and the clock control unit 118 are controlled in an initialization control unit 102 will be described. Additionally, in the reset operations of a plurality of circuit blocks, control until the reset operations of all circuit blocks are completed is performed in the initialization control unit 102.

That is, the system control unit 106 according to the third embodiment need only issue the reset requests of a plurality of circuit blocks to the initialization control unit 102 and then wait for return of reset operation completion notifications for all the circuit blocks requested to be reset. Hence, in the third embodiment, as shown in FIG. 14, the output of a reset start instruction unit 116 is directly connected to the reset control unit 117 and the clock control unit 118. In addition, the output of a reset completion notification unit 120 is connected not only to the system control unit 106 but also to a reset request reception unit 119.

As described above, the initialization control unit 102 can bear the load of reset control/clock control performed by the system control unit 106.

Modification of Embodiments

In the above-described first to third embodiments, an example in which the detection unit 108 and the data storage unit 107 are provided in the semiconductor integrated circuit 101 has been described. However, these components may be installed outside the semiconductor integrated circuit 101 as long as they are in the same system (or information processing apparatus).

Figure 15:
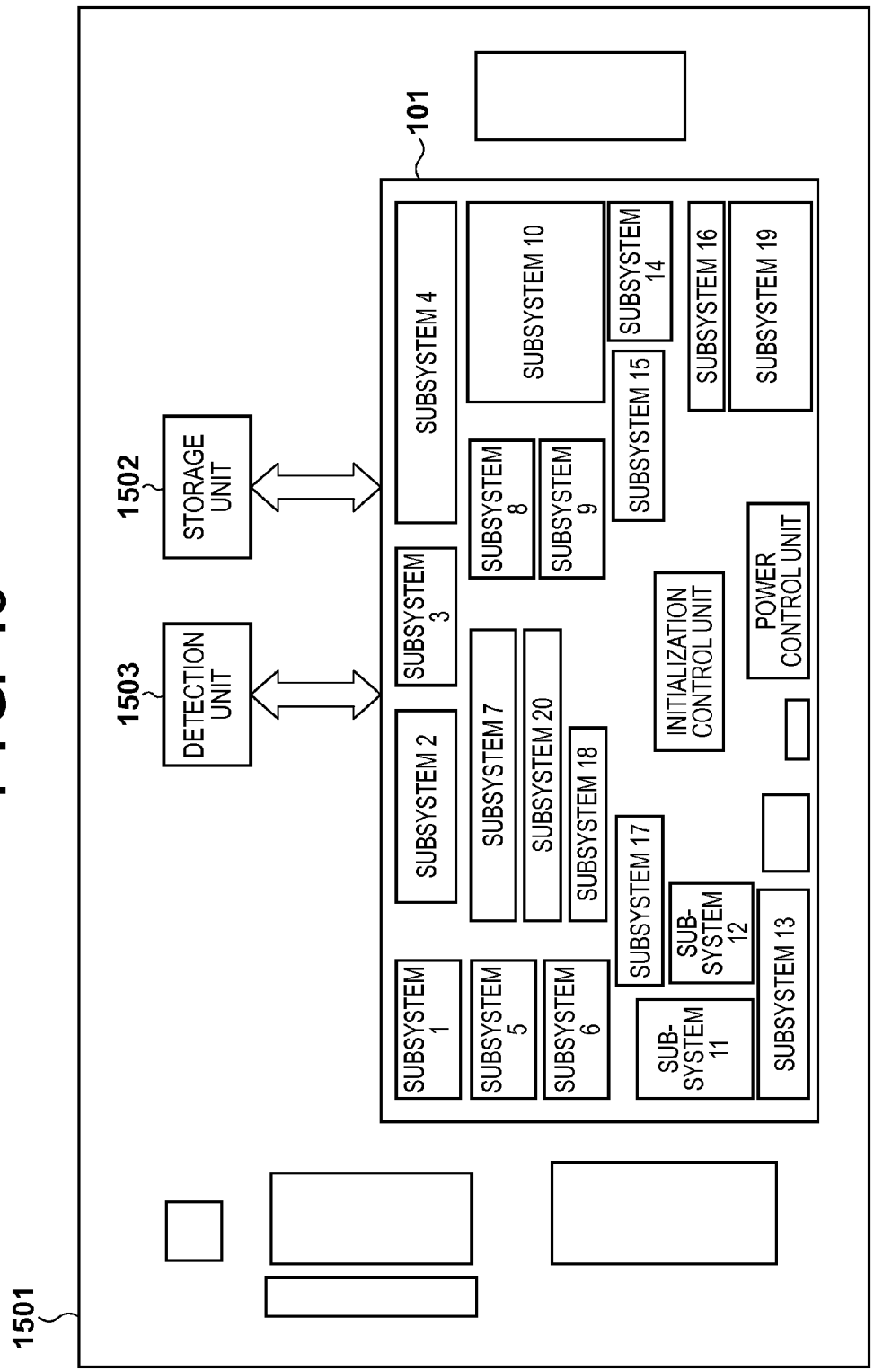
FIG. 15 is a block diagram showing the arrangement of a power saving system according to a modification.

FIG. 15 shows the arrangement of a power saving system 1501. The power saving system 1501 shown in FIG. 15 is implemented as, for example, a printed board on which the semiconductor integrated circuit 101 is mounted. A storage unit 1502 holds various tables and data stored in the data storage unit 107 shown in FIG. 1. Note that the storage unit 1502 also stores a boot program used when activating the semiconductor integrated circuit 101. A detection unit 1503 has the same arrangement and functions as the detection unit 108 shown in FIG. 3. However, the temperature sensor 305 shown in FIG. 3 is arranged in the semiconductor integrated circuit 101.

According to the power saving system 1501, since the detection unit 108 and the data storage unit 107 need not be provided in the semiconductor integrated circuit 101, the chip size of the semiconductor integrated circuit 101 can be reduced, and the cost can be reduced. The effect of reducing the chip size of the semiconductor integrated circuit 101 and reducing the cost can be obtained only by arranging one of the detection unit 108 and the data storage unit 107 outside the semiconductor integrated circuit 101, as a matter of course.

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-228754 filed Nov. 1, 2013 which is hereby incorporated by reference herein in its entirety.

What is claimed is:

1. A semiconductor device comprising:
a plurality of circuit blocks, each of which performs an assigned operation, and performs a reset operation in a case where recovering from a shutdown state of power supply;
a power control unit configured to control power supply to a power domain comprising at least one circuit block; and
an initialization control unit configured to control reset operation parameters of the plurality of circuit blocks as reset operation targets, for which power supply is resumed by the power control unit, so as to meet a power condition that makes power dissipation of the semiconductor device by the reset operation not more than a predetermined power based on a number of clock cycles required by each of the plurality of circuit blocks as the reset operation targets to do the reset operation,
wherein the initialization control unit comprises:
an order determination unit configured to determine priority orders of the reset operations of the plurality of circuit blocks as the reset operation targets in descending order of the number of clock cycles; and
a parameter selection unit configured to select a reset operation parameter based on the priority order for each of the plurality of circuit blocks as the reset operation targets.

2. The semiconductor device according to claim 1, wherein the initialization control unit controls the reset operation parameters based on a parameter table representing a relationship between a reset operation parameter and dynamic power at time of a reset operation of the circuit block.

3. The semiconductor device according to claim 1, further comprising:
a clock control unit configured to control clock supply to each of the plurality of circuit blocks; and a parameter setting unit configured to set, in the clock control unit, the reset operation parameters selected by the parameter selection unit, wherein the clock control unit supplies a clock having a frequency according to the reset operation parameter set for each of the plurality of circuit blocks as the reset operation targets to the circuit block.

4. The semiconductor device according to claim 3, wherein the parameter setting unit further sets, in the power control unit, the reset operation parameters selected by the parameter selection unit, and wherein the power control unit supplies a voltage according to the reset operation parameter set for each of the plurality of circuit blocks as the reset operation targets to the circuit block.

5. The semiconductor device according to claim 3, wherein the parameter selection unit selects the reset operation parameter that meets the power condition and shortens a reset operation period to a minimum period.

6. The semiconductor device according to claim 3, wherein the parameter selection unit comprises:
a selector configured to select a reset operation parameter candidate of the circuit block from a predetermined selection target group recorded in the parameter table;
an estimator configured to estimate power dissipation of the semiconductor device in a case where performing the reset operation using the reset operation parameter candidate; and
a determiner configured to determine whether or not the estimated power dissipation meets the power condition,
wherein in a case where determining that the power condition is met, the parameter setting unit sets the reset operation parameter candidate as the reset operation parameter, and
wherein in another case where determining that the power condition is not met, processes of the selector, the estimator, and the determiner are repeated.

7. The semiconductor device according to claim 6, wherein in a case where the parameter table comprises selectable reset operation parameter candidates no longer due to repetition of the selection, the selector selects a reset operation parameter that the reset operation is not performed as the reset operation parameter candidate.

8. The semiconductor device according to claim 6, further comprising a detection unit configured to detect the power dissipation and temperature of the semiconductor device,
wherein the estimator adds an increase in the power dissipation caused by the reset operation, which is calculated based on the parameter table and the detected temperature, to the detected power dissipation so as to estimate the power dissipation of the semiconductor device.

9. The semiconductor device according to claim 8, wherein the estimator estimates an increase in the dynamic power dissipation caused by the reset operation based on dynamic power dissipation recorded in the parameter table in correspondence with the reset operation parameter candidate.

10. The semiconductor device according to claim 9, wherein the estimator estimates an increase in the temperature of the semiconductor device corresponding to the increase in the dynamic power dissipation by referring to the parameter table, and estimates an increase in static power dissipation corresponding to an estimated value of the increase in the temperature and the detected temperature by referring to the parameter table.

11. The semiconductor device according to claim 1, further comprising:
a detection unit configured to detect completion of the reset operation of each circuit block as the reset operation target; and
a system control unit configured to instruct the initialization control unit to continue control of the reset operation parameters for the circuit blocks whose reset operations are not completed until completion of the reset operation is detected for all of the plurality of circuit blocks as the reset operation targets.

12. The semiconductor device according to claim 1, wherein the initialization control unit comprises:
a reception unit configured to receive an instruction to designate the plurality of circuit blocks as the reset operation targets; and
a detection unit configured to detect completion of the reset operation of each circuit block as the reset operation target,
wherein the initialization control unit continues control of the reset operation parameters for the circuit blocks whose reset operations are not completed until completion of the reset operation is detected for all of the plurality of circuit blocks as the designated reset operation targets.

13. The semiconductor device according to claim 1, wherein the reset operation parameter is an operating frequency of the circuit block.

14. The semiconductor device according to claim 1, wherein the reset operation parameter comprises an operating frequency and an operating voltage of the circuit block.

15. The semiconductor device according to claim 2, further comprising a holding unit configured to hold the parameter table in advance.

16. A method of control a semiconductor device comprising a plurality of circuit blocks, each of which performs an assigned operation, and performs a reset operation in a case where recovering from a shutdown state of power supply, the method comprising:
a first controlling step controlling power supply to a power domain comprising at least one circuit block; and
a second controlling step controlling reset operation parameters of the plurality of circuit blocks as reset operation targets, for which power supply is resumed in the first controlling step, so as to meet a power condition that makes power dissipation of the semiconductor device by the reset operation not more than a predetermined power based on a number of clock cycles required by each of the plurality of circuit blocks as the reset operation targets to do the reset operation,
wherein the initialization control unit comprises:
an order determination unit configured to determine priority orders of the reset operations of the plurality of circuit blocks as the reset operation targets in descending order of the number of clock cycles; and
a parameter selection unit configured to select a reset operation parameter based on the priority order for each of the plurality of circuit blocks as the reset operation targets.

* * * * *